US012328520B2

(12) United States Patent
Kobayashi

(10) Patent No.: US 12,328,520 B2
(45) Date of Patent: Jun. 10, 2025

(54) IMAGE PICKUP DEVICE

(71) Applicant: CANON KABUSHIKI KAISHA, Tokyo (JP)

(72) Inventor: Hirokazu Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 168 days.

(21) Appl. No.: 18/360,004

(22) Filed: Jul. 27, 2023

(65) Prior Publication Data
US 2023/0370745 A1 Nov. 16, 2023

Related U.S. Application Data

(63) Continuation of application No. PCT/JP2021/048319, filed on Dec. 24, 2021.

(30) Foreign Application Priority Data

Feb. 15, 2021 (JP) ................................. 2021-022046

(51) Int. Cl.
H04N 25/771 (2023.01)
H04N 25/772 (2023.01)
(Continued)

(52) U.S. Cl.
CPC ......... H04N 25/771 (2023.01); H04N 25/772 (2023.01); H04N 25/78 (2023.01);
(Continued)

(58) Field of Classification Search
CPC ............... H10F 39/809; H10F 39/8037; H10F 39/8063; H10F 39/12; H10F 39/199;
(Continued)

(56) References Cited

U.S. PATENT DOCUMENTS

2013/0215300 A1* 8/2013 Kobayashi ............ H10F 39/802
348/294
2017/0078557 A1* 3/2017 Kawabata ............ H04N 25/705
(Continued)

FOREIGN PATENT DOCUMENTS

JP 2010-219339 A 9/2010
JP 2014138406 A 7/2014
(Continued)

OTHER PUBLICATIONS

International Search Report issued on Mar. 1, 2022, that issued in PCT Application No. PCT/JP2021/048319.
Oct. 28, 2024 Japanese Office Action, without an English Translation, that issued in Japanese Patent Application No. 2021-022046.

Primary Examiner — Marly S Camargo
(74) Attorney, Agent, or Firm — Cowan, Liebowitz & Latman, P.C.

(57) ABSTRACT

An image pickup device includes a plurality of pixels each provided with a plurality of photoelectric conversion portions and outputting a first voltage signal based on a charge of at least one photoelectric conversion portion of the plurality of photoelectric conversion portions and a second voltage signal based on a combined charge of charges of the plurality of photoelectric conversion portions, and a plurality of holding circuits provided in a one-to-one relationship with the plurality of pixels, the plurality of holding circuits holding voltage signals based on charges generated by the plurality of photoelectric conversion portions, and each one of the plurality of holding circuits includes a plurality of holding portions including a first holding portion that holds the first voltage signal and a second holding portion that holds the second voltage signal.

11 Claims, 14 Drawing Sheets

(51) Int. Cl.
- *H04N 25/778* (2023.01)
- *H04N 25/78* (2023.01)
- *H04N 25/79* (2023.01)
- *H10F 39/00* (2025.01)
- *H10F 39/12* (2025.01)

(52) U.S. Cl.
CPC ....... *H10F 39/8037* (2025.01); *H10F 39/809* (2025.01); *H10F 39/8063* (2025.01)

(58) Field of Classification Search
CPC ...... H04N 25/77; H04N 25/778; H04N 25/79; H04N 25/771; H04N 25/772; H04N 25/78
See application file for complete search history.

(56) References Cited

U.S. PATENT DOCUMENTS

| | | | | |
|---|---|---|---|---|
| 2017/0237915 A1* | 8/2017 | Ogura | .................. | H04N 25/625 |
| 2019/0333949 A1* | 10/2019 | Ohya | .................... | H04N 23/73 |
| 2024/0340555 A1* | 10/2024 | Matsuura | ................ | H10F 39/12 |

FOREIGN PATENT DOCUMENTS

| | | |
|---|---|---|
| JP | 2017-022578 A | 1/2017 |
| JP | 2017041735 A | 2/2017 |
| JP | 2020088655 A | 6/2020 |
| JP | 2020136446 A | 8/2020 |
| JP | 2021-068758 A | 4/2021 |
| JP | 2013-211832 A | 10/2023 |

\* cited by examiner

F I G. 14
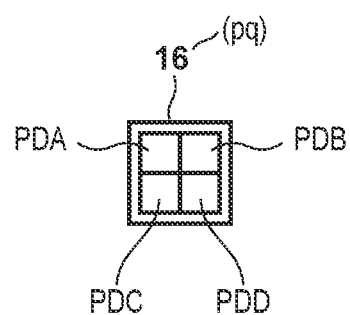

IMAGE PICKUP DEVICE

CROSS-REFERENCE TO RELATED APPLICATIONS

This application is a Continuation of International Patent Application No. PCT/JP2021/048319, filed Dec. 24, 2021, which claims the benefit of Japanese Patent Application No. 2021-022046, filed Feb. 15, 2021, both of which are hereby incorporated by reference herein in their entirety.

BACKGROUND OF THE INVENTION

Field of the Invention

The present invention relates to an image pickup device.

Background Art

In the field of CMOS type solid state image pickup devices, a global shutter function in which all pixels simultaneously accumulate charge is known as a function for eliminating distortion in captured images caused when capturing an image of a moving object.

Recent advances in CMOS type solid state image pickup device technology include back-illuminated technology in which light is received at a surface on the opposite side to a surface where a pixel circuit is formed and multilayer structure technology in which semiconductor substrates are bonded together in a back-illuminated image pickup device. In the structure described in PTL 1, memory for holding the charge required for the global shutter function is provided on a substrate different from a substrate the pixel circuit is provided on for each pixel.

Also, image pickup devices are becoming widely used that enable an imaging signal and a focus detection signal via a phase detection method for detecting the defocus amount to be simultaneously obtained via receiving light via a divided-pupil imaging optical system. In the technology described in PTL 2, each pixel includes a plurality of photoelectric conversion portions below one micro lens to divide the pupil of the optical system, and a signal of at least one photoelectric conversion portion and an imaging signal which is the sum of all of the signals of the plurality of photoelectric conversion portions are output.

CITATION LIST

Patent Literature

PTL 1: Japanese Patent Laid-Open No. 2010-219339
PTL 2: Japanese Patent Laid-Open No. 2013-211832

However, in an example such as that described in PTL 1 in which, in addition to a memory for holding charge for each pixel, an AD conversion circuit is also provided on a second semiconductor substrate which is different from the first semiconductor substrate where a photoelectric conversion portion is disposed, the area of the second semiconductor substrate is increased and the effect of reducing the cost per chip is reduced. Also, with a configuration in which each pixel is provided with a plurality of photoelectric conversion portions and a focus detection signal via a phase detection method and an imaging signal can be output, not only memory but an AD conversion circuit is also required for the plurality of photoelectric conversion portions provided for each pixel. This further increases the area of the second semiconductor substrate.

The present invention has been made in consideration of the aforementioned problems and realizes an image pickup device provided with a global shutter function and with enhanced efficiency in terms of semiconductor substrate area.

SUMMARY OF THE INVENTION

According to the present invention, there is provided an image pickup device comprising: a plurality of pixels each provided with a plurality of photoelectric conversion portions and outputting a first voltage signal based on a charge of at least one photoelectric conversion portion of the plurality of photoelectric conversion portions and a second voltage signal based on a combined charge of charges of the plurality of photoelectric conversion portions; and a plurality of holding circuits provided in a one-to-one relationship with the plurality of pixels, the plurality of holding circuits holding voltage signals based on charges generated by the plurality of photoelectric conversion portions, wherein each one of the plurality of holding circuits includes a plurality of holding portions including a first holding portion that holds the first voltage signal and a second holding portion that holds the second voltage signal.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain principles of the invention.

FIG. 1 is a diagram illustrating the configuration of a light-receiving surface of a first substrate of an image pickup device according to a first embodiment of the present invention.

FIG. 2 is a diagram illustrating the configuration of a surface on the opposite side to the light-receiving surface of the first substrate according to the first embodiment.

FIG. 14 is a diagram illustrating the configuration of a pixel according to a fifth embodiment.

DESCRIPTION OF THE EMBODIMENTS

Figure 3:
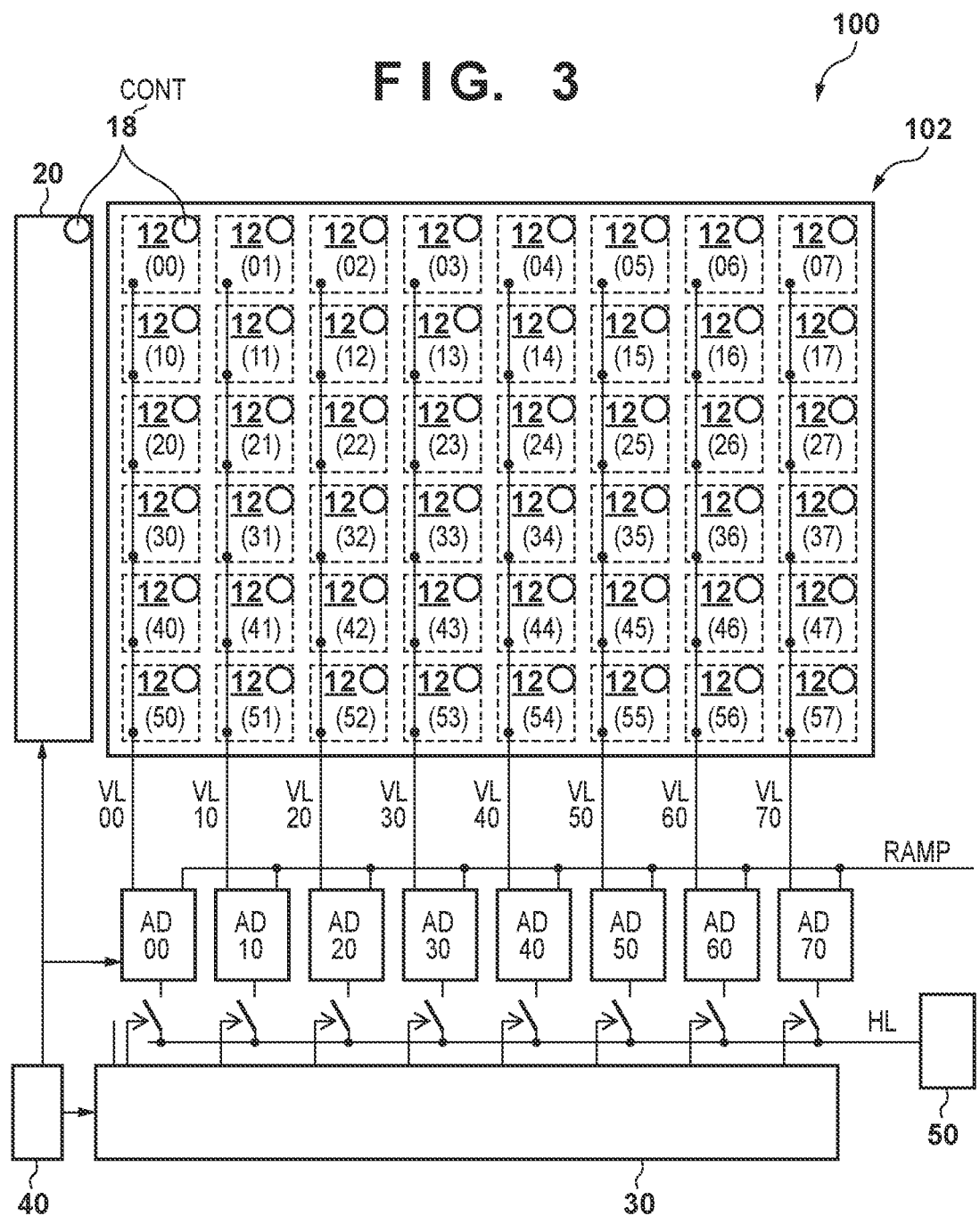
FIG. 3 is a diagram illustrating the configuration of a second substrate according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

Figures 1, 2:
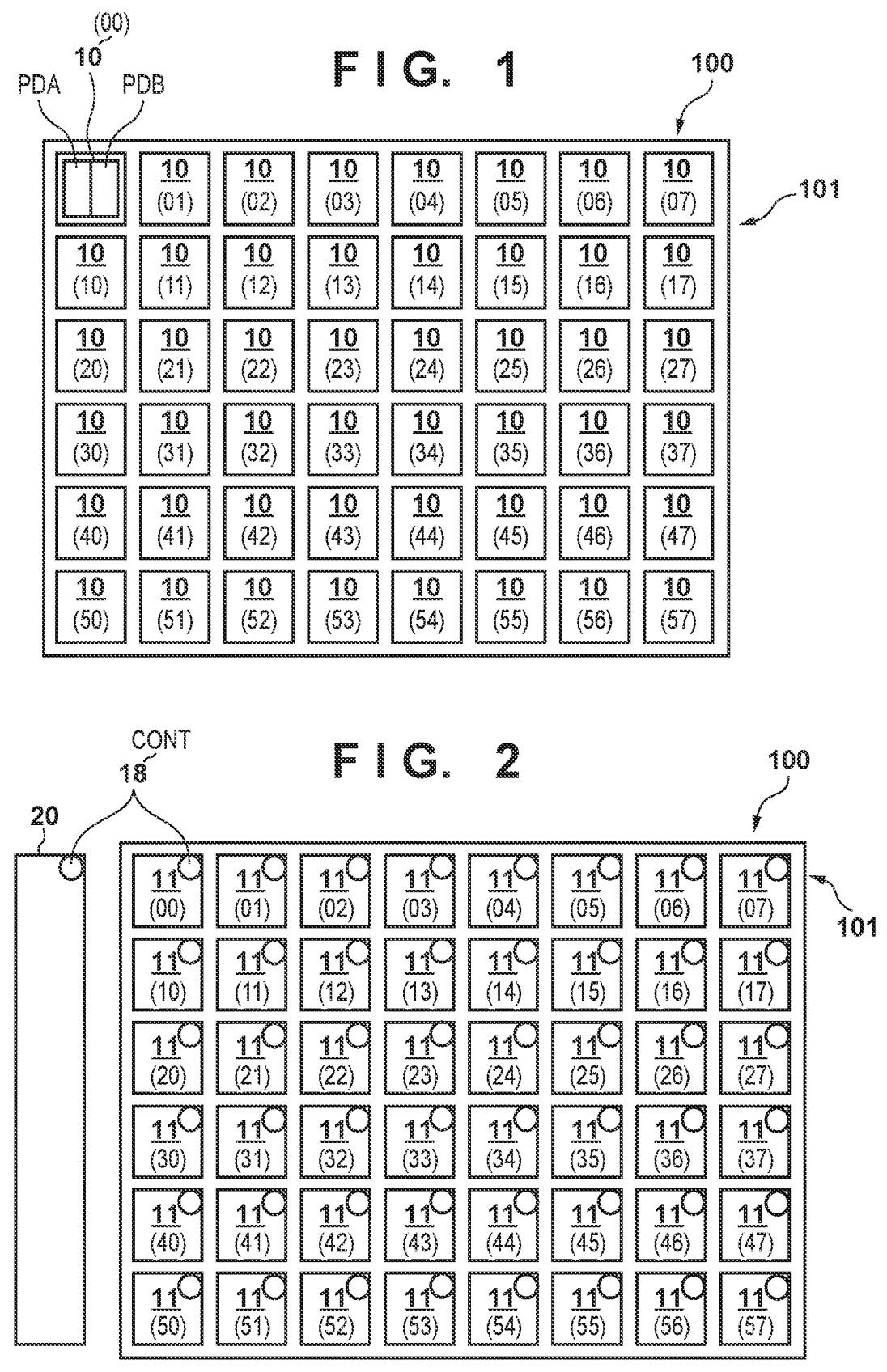

FIG. 1 is a diagram illustrating the configuration of a light-receiving surface of a first semiconductor substrate 101 provided with a photoelectric conversion portion (a photodiode, hereinafter referred to as PD) in an image pickup device 100 according to the first embodiment of the present invention.

The image pickup device 100 according to the present embodiment has a multilayer structure in which a plurality of semiconductor substrates including the first semiconductor substrate 101 are stacked on one another.

As illustrated in FIG. 1, the reference sign 10 (pq) denotes a pixel located in the p-th row and the q-th column. In FIG. 1, a 6×8 grid of pixels is disposed on the light-receiving surface, but in practice, multiple pixels in the range of tens of millions are arranged in a two-dimensional pattern. Also, since light is received via a divided pupil region of a non-illustrated imaging optical system, all of the pixels 10 (pq) include two photodiodes PDA and PDB eccentrically located with respect to a solitary micro lens as illustrated by the pixel 10 (00).

FIG. 2 is a diagram illustrating the configuration of the surface on the opposite side to the light-receiving surface of the first semiconductor substrate 101 in the image pickup device 100 according to the present embodiment. On the non-light-receiving surface, corresponding to the pixels 10 (pq), pixel circuits 11 (pq) are arranged in a two-dimensional pattern. The voltage signals, which are the outputs of the pixel circuits 11 (pq), are transferred to another semiconductor substrate (hereinafter referred to as a second semiconductor substrate) 102 (see FIG. 3) forming a multilayer structure via an electrical contact (hereinafter referred to as CONT) 18 for each pixel.

Also, the CONT 18 is joined to a vertical scanning circuit 20 of the second semiconductor substrate 102, and a control signal from the vertical scanning circuit 20 is supplied to the photodiode PDA and PDB and the like on the first semiconductor substrate 101 to realize a global shutter operation and the like. The drive timing of the photodiode PDA and PDB and the like will be described below.

An N-type silicon substrate is used as the first semiconductor substrate 101, for example. To accumulate the electrons of the electron/hole pairs generated when light is received, the photodiodes PDA and PDB are N-type semiconductor regions. Also, the photodiodes PDA and PDB are separated by a P-type semiconductor region disposed therebetween.

FIG. 3 is a diagram illustrating the configuration of the second semiconductor substrate 102 of the image pickup device 100 according to the present embodiment. Corresponding to the pixel circuits 11 (pq) of the first semiconductor substrate 101, accumulation circuits 12 (pq) are arranged in a two-dimensional pattern. Since the pixel circuits 11 (pq) are connected by the CONTs 18, which are the contacts, the voltage signals, which are the outputs, can be accumulated in a batch by the accumulation circuits 12 (pq) (all pixel batch accumulation enabled). In this manner, a global shutter can be realized.

The accumulated voltage signals are scanned in column order by the vertical scanning circuit 20 that scans the accumulation circuits 12 (pq) and output to an AD conversion circuit ADq0 provided at n number per column (n is an integer) via column output lines VLq0. The AD conversion circuit ADq0 performs AD conversion on the input signals. The digital signals obtained via AD conversion are scanned in column order by a horizontal scanning circuit 30 and outputs to an output portion 50 via a row output line HL.

The output portion 50 includes a known parallel/serial conversion circuit (hereinafter, referred to as a P/S conversion circuit) and sequentially converts the digital imaging signals output from the row output line HL into a high-speed serial transmission format such as LVDS. Also, the output portion 50 may include a circuit for executing correction processing for defective pixels or the like.

In the image pickup device 100 according to the present embodiment, one column output line VLq0 is disposed in each column, and all rows in the same column are shared. Also, one AD conversion circuit ADq0 is disposed in each column. A pixel signal output from the column output lines VLq0 and a reference signal RAMP that varies proportional to time are input into the AD conversion circuit ADq0.

Note that the configuration of the AD conversion circuit ADq0, the accumulation circuit 12 (pq), the pixel 10 (pq), and the pixel circuit 11 (pq) will be described below using equivalent circuit diagrams. Also, a predetermined drive timing signal sent to the accumulation circuits 12 (pq) in row order by the vertical scanning circuit 20, a control signal for the AD conversion circuits ADq0, and a horizontal scanning timing signal are generated by a timing generating circuit 40. The drive timing will be described below using a timing chart.

Figure 4:
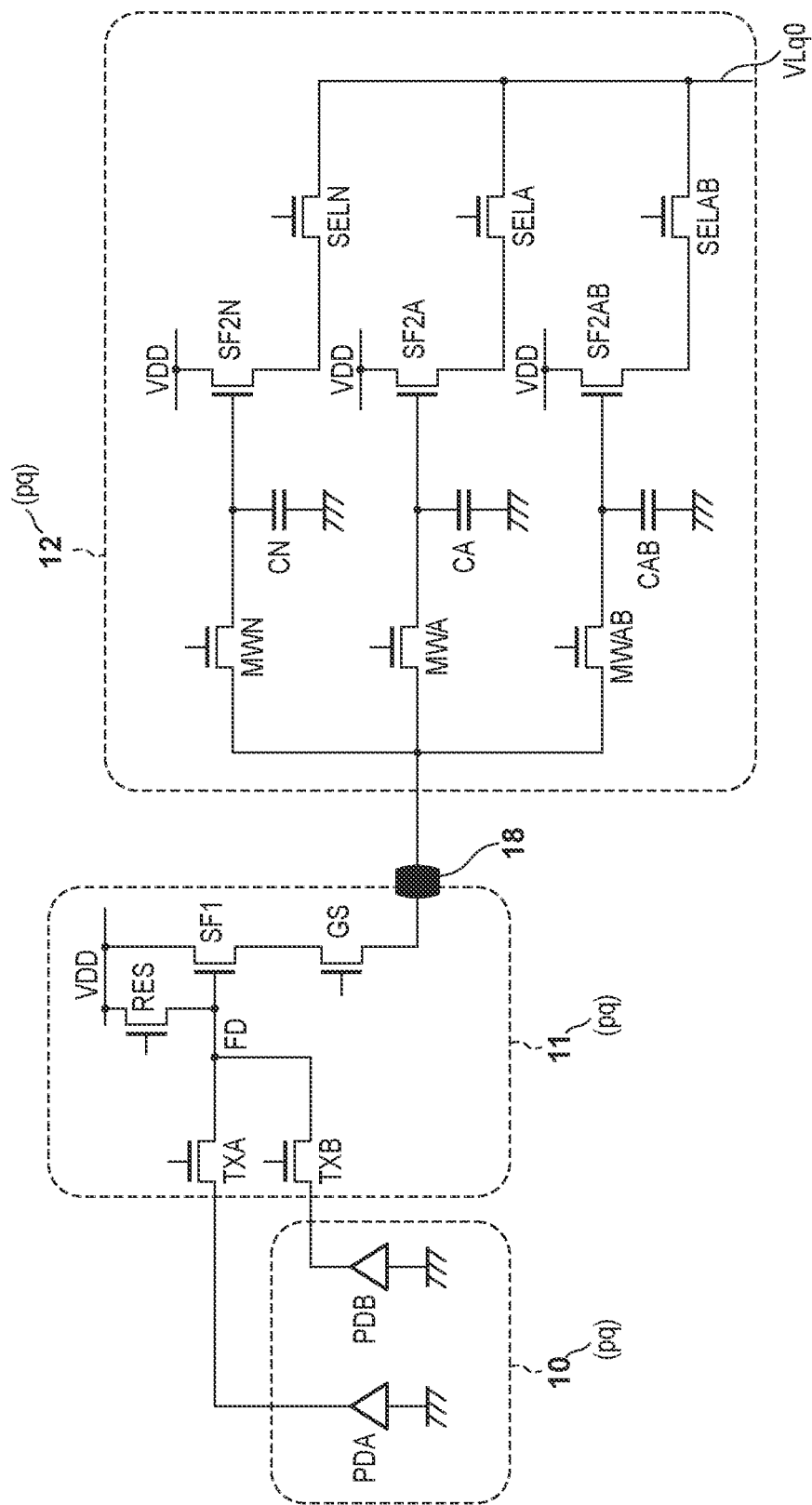
FIG. 4 is an equivalent circuit diagram illustrating the configuration of a pixel, a pixel circuit, and an accumulation circuit according to the first embodiment.

Next, FIG. 4 is a diagram illustrating an example of an equivalent circuit of the pixel 10 (pq), the pixel circuit 11 (pq), and the accumulation circuit 12 (pq) in the image pickup device 100 according to the present embodiment.

Firstly, the pixel 10 (pq) includes the photodiodes PDA and PDB. Also, the pixel circuit 11 (pq) includes transfer transistors TXA and TXB that transfer the charge generated at the photodiodes PDA and PDB to the charge/voltage conversion portion (floating diffusion portion, hereinafter referred to as an FD portion), a first amplification transistor (hereinafter referred to as SF1) forming a source follower circuit by a non-illustrated current source and including a gate connected to the FD portion, a reset transistor RES for resetting the FD portion via a predetermined power supply VDD, and a batch transfer transistor GS including a drain connected to the source of the SF1.

Of the transistors described above, the gates of the reset transistor RES, the transfer transistors TXA and TXB, and the batch transfer transistor GS can be controlled by the vertical scanning circuit 20. Thus, control to read out a signal corresponding to the charge generated at only the photodiode PDA and control to read out a signal corresponding to the sum of the charges generated at the photodiodes PDA and PDB are performed in one batch for all of the pixels. Note that an overflow drain may be provided for the discharging unnecessary charge of the photodiodes PDA and PDB.

The source of the batch transfer transistor GS is connected to the accumulation circuit 12 (pq) via the CONT 18. The accumulation circuit 12 (pq) is provided with m number of accumulation capacitors (storage portions) (m is an integer of 2 or more) for accumulating voltage signals of the pixel circuit 11 (pq). In the present embodiment, three accumulation capacitors, CN, CA, and CAB, are provided.

The accumulation capacitor CN accumulates the voltage after reset is cancelled at the FD of the pixel circuit 11 (pq) (hereinafter referred to as an N signal). Also, the accumulation capacitor CA accumulates the voltage of the FD reduced in response to the signal charge of the photodiode PDA (hereinafter referred to as an A signal). Furthermore, the accumulation capacitor CAB accumulates the voltage of the FD reduced in response to the combined signal charge of the photodiodes PDA and PDB (hereinafter referred to as an imaging signal).

A capacitance element with the surface area increased using a trench structure may be used in the accumulation capacitors. Also, a high capacitance element formed between wiring lines at a section where the high-permittivity material is used between wiring layers of the second semiconductor substrate 102 may be used. Furthermore, a transistor gate oxide film of the second semiconductor substrate 102 may be partially used. By increasing the accumulation capacity in this manner, thermal noise can be reduced, allowing the image quality to be enhanced.

Also, the accumulation circuit 12 (pq) is provided with memory write transistors MWN, MWA, and MWAB for writing the voltage signals to the three accumulation capacitors described above.

Also, the accumulation capacitors CN, CA, and CAB described above are connected to the gates of second amplification transistors SF2N, SF2A, and SF2AB and form a source follower circuit using a non-illustrated current source.

Selection transistors SELN, SELA, and SELAB are provided to selectively transfer the source voltages of the second amplification transistors to the column output line VLq0. The drive method and sequence for outputting the N signal, the A signal, and the imaging signal via these selection transistors is described below using a timing chart, but naturally, these selection transistors are also used for the row direction scanning described above.

Figure 5:
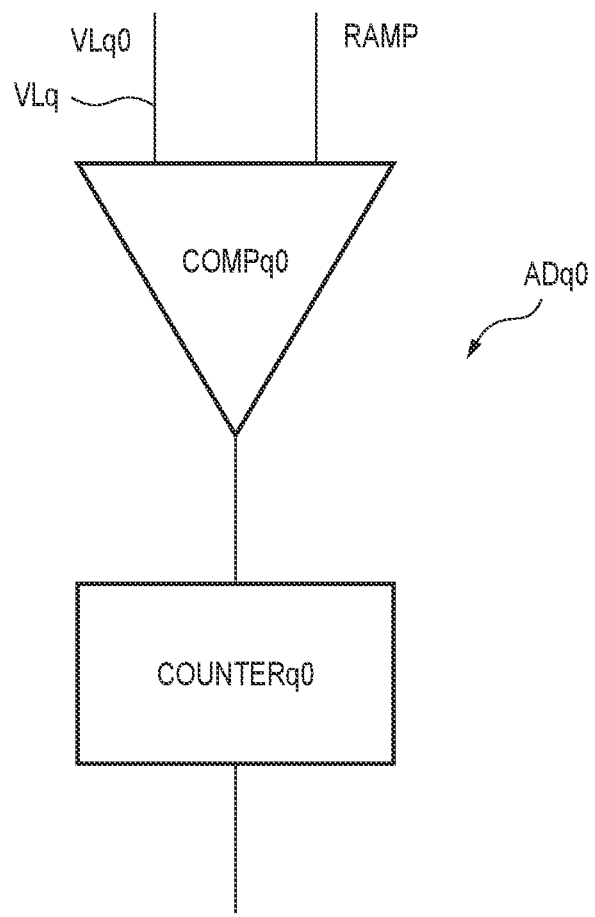
FIG. 5 is an equivalent circuit diagram illustrating the configuration of an AD conversion circuit according to the first embodiment.

Next, FIG. 5 is a diagram illustrating an example of an equivalent circuit of the AD conversion circuit ADq0 according to the present embodiment.

The AD conversion circuit ADq0 is provided with a comparator COMPq0 that takes a pixel signal VLq output from the column output line VLq0 and the reference signal RAMP as inputs and a counter COUNTERq0 that is stopped and controlled by the output polarity of the comparator COMPq0. The comparator COMPq0 compares the voltages of the pixel signal VLq and the reference signal RAMP. When the value of the pixel signal VLq is higher, the output polarity is Hi, and when the value of the pixel signal VLq is lower, the output polarity is Lo. When the non-illustrated reset signal is cancelled, the counter COUNTERq0 continues counting when the output polarity of the comparator COMPq0 is Hi and stops when the output polarity is Lo.

In this manner, for example, when the voltage of the pixel signal VLq reduced in response to the signal charge of the photodiode PDA is less than the reference signal RAMP that decreases proportional to time, the counter can be stopped. This allows the AD conversion to be performed on the voltage of the pixel signal VLq. Specifically, since the imaging signal has a wider voltage range than the A signal and the A signal has a wider voltage range than the N signal, even if the AD conversion circuits can be made parallel, it is more time efficient to perform AD conversion of the various types of signals with different voltage ranges sequentially at one AD conversion circuit.

Figure 6:
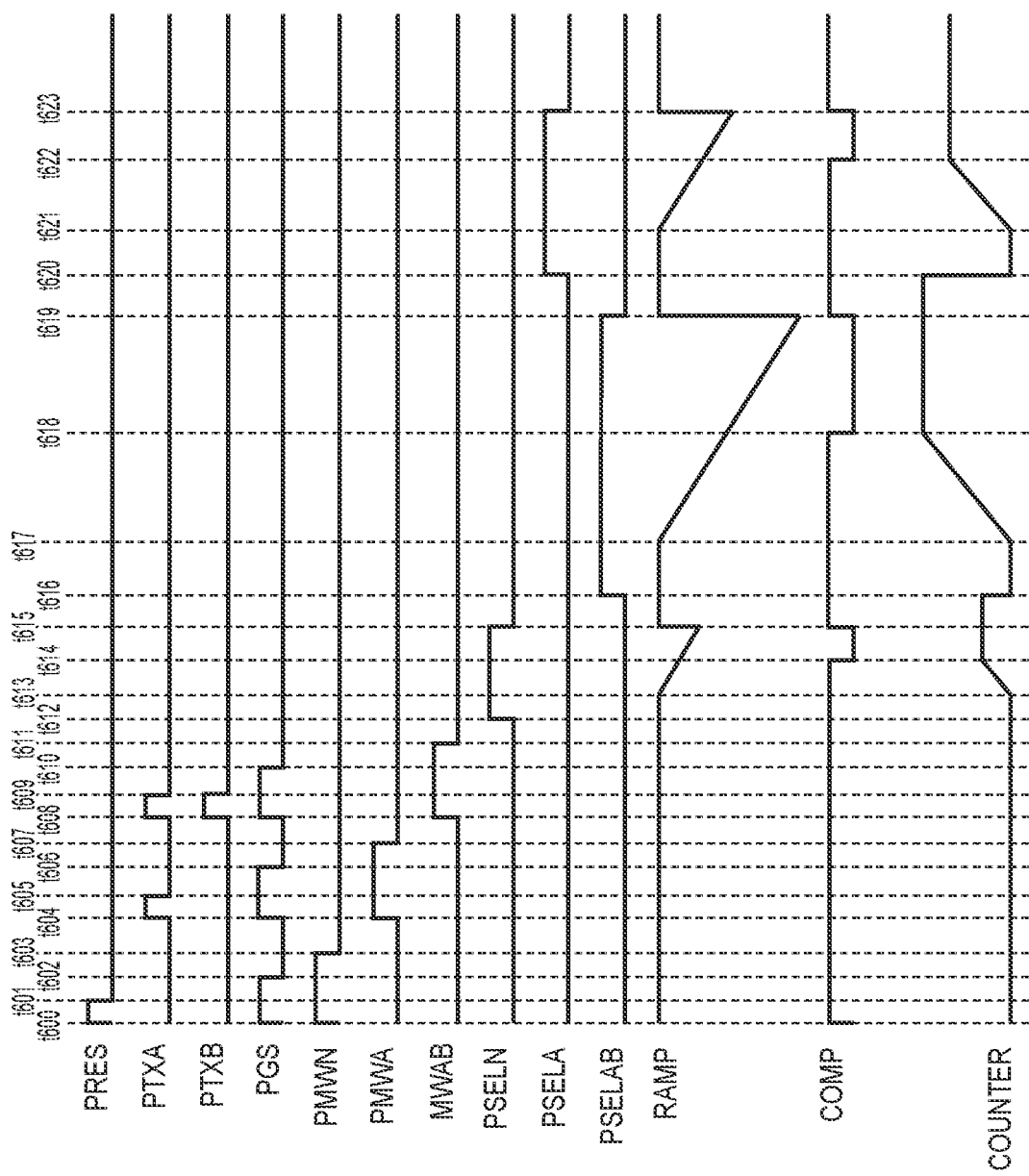
FIG. 6 is a timing chart illustrating a drive method of the image pickup device according to the first embodiment.

Next, a drive method of the image pickup device according to the present embodiment will be described. FIG. 6 is a timing chart illustrating the drive method of the image pickup device according to the present embodiment. In FIG. 6, the reference signs PRES, PTXA, PTXB, PGS, PMWN, PMWA, PMWAB, PSELN, PSELA, and PSELAB denote the control signals associated with the gates of RES, TXA, TXB, GS, MWN, MWA, MWAB, SELN, SELA, and SELAB, and Hi means that the transistor is ON and Lo means that the transistor is OFF. Also, the reference sign RAMP denotes the voltage of the reference signal RAMP supplied to the AD conversion circuit ADq0, the reference sign COMP denotes the output polarity of the comparator COMPq0, and the reference sign COUNTER denotes the counter value of the counter COUNTERq0.

In FIG. 6, time t600 to time t611 represents the so-called global shutter operation with the voltage signals corresponding to the charges accumulated in a batch for all of the pixels being transferred in a batch to the second semiconductor substrate 102. Also, from time t612 to time t623 represents an operation in which AD conversion is sequentially performed on the signals of the accumulation circuits 12 (0q) disposed in the 0-th row of the second semiconductor substrate 102. Via the vertical scanning circuit 20, the driving in time t612 to time t623 is executed from the accumulation circuit 12 (0q) disposed in the 0-th row, the accumulation circuit 12 (1q) disposed in the 1-th row, to the final 5-th row, with the signals from all of the pixels being output.

Firstly, from time t600 to time t601, the control signal PRES turns to Hi and the FD is reset to the power supply VDD.

Subsequently, at time t602, the control signal PGS turns to Lo, and at time t603, the control signal PMWN turns to Lo. Thus, the reset of the FD is cancelled, and the static voltage, that is the N signal, is written to the accumulation capacitor CN of the accumulation circuit 12 (pq). The N signal, which is the voltage signal, is written to the accumulation capacitor CN when the control signal PMWN turns to Lo after the control signal PGS, and thus the control signal PGS and the control signal PMWA may be Hi from time t600.

Subsequently, from time t604 to time t605, the control signal PTXA turns to Hi, and the signal charge of the photodiode PDA is transferred to the FD.

Subsequently, at time t606, the control signal PGS turns to Lo, and at time t607, the control signal PMWA turns to Lo. Thus, the post-reset-cancellation FD is reduced and becomes static in response to the signal charge from the photodiode PDA. Then, the static voltage, that is the A signal, is written to the accumulation capacitor CA of the accumulation circuit 12 (pq). As with the N signal, the control signal PGS and the control signal PMWA may be Hi from time t604.

Subsequently, from time t608 to time t609, the control signal PTXA and the control signal PTXB turn to Hi, and the signal charges of the photodiodes PDA and PDB are transferred to the FD.

Subsequently, at time t610, the control signal PGS turns to Lo, and at time t611, the control signal PMWAB turns to Lo. Thus, the post-reset-cancellation FD is reduced and becomes static in response to the signal charges from the photodiodes PDA and PDB. Then, the static voltage, that is the imaging signal, is written to the accumulation capacitor CAB of the accumulation circuit 12 (pq). As with the N signal, the control signal PGS and the control signal PMWA may be Hi from time t608.

Up until here, the FD has not been reset other than from time t600 to time t601. With this configuration and drive method for the pixel circuits 11 (pq) and the correlated double sampling of the imaging signal and N signal described below, the noise added to the imaging signal can be reduced.

The voltage signals written to the accumulation capacitors CN, CA, and CAB are AD-converted by the process described below in a Hi period in which the vertical scanning circuit 20 sequentially turns the control signals PSELN, PSELAB, and PSELA to Hi.

In other words, from time t612 to time t615, the control signal PSELN turns to Hi and the N signal that appears at the column output line VLq0 and the reference signal RAMP that starts decreasing from time t613 are compared by the comparator COMPq0. At any time before time t615 (time t614 in FIG. 6), when this size relationship is reversed, the polarity of the comparator COMPq0 changes to Lo, and in response to this, the count value of the counter COUNTERq0 stops.

Here, the COUNTER q0 starts counting together with the start of the decrease of the reference signal RAMP at time t613, and from time t615 to time t616, the count value of the N signal is stored at a non-illustrated latch circuit. In some cases, a down-count may be used for the N signal. In this case, correlated double sampling can be easily perform by up-counting when performing AD conversion of the imaging signal from time t616 to time t619.

At time t615, the reference signal RAMP resets to the same voltage from before time t613.

From time t616 to time t619, by the control signal PSELAB turning to Hi and by an operation similar to that from time t612 to time t615, AD conversion is performed on the imaging signal (A+B signal). Also, from time t620 to time t623, by the control signal PSELA turning to Hi and by an operation similar to that from time t612 to time t615, AD conversion is performed on the A signal.

After time t623, the AD conversion result of the latched N signal, the AD conversion result of the imaging signal, and the AD conversion result of the A signal are sequentially scanned in the column direction by the horizontal scanning circuit 30 and transferred to a non-illustrated image processor via the row output line HL and the output portion 50. The correlated double sampling of the imaging signal and the N signal and the A signal and the N signal is performed by subtraction processing at the output portion 50. Also, as described above, a down-count may be used for the N signal.

Here, the AD conversion period of the imaging signal has a longer duration than the AD conversion period of the N signal but has the same reference signal RAMP inclination as for the N signal. In a similar manner, the AD conversion period of the A signal has a shorter duration that that of the imaging signal but a longer duration than that of the N signal. Since the A signal corresponds to a signal charge generated by light passing through a portion of the pupil of the imaging optical system being received, the voltage range is less than that of the imaging signal obtained by light passing through the entire pupil of the imaging optical system being received, and thus a short AD conversion period is sufficient. Basically, the N signal which does not include a received light signal has an even smaller voltage range than that of the A signal and thus naturally a shorter AD conversion period than that of the A signal is sufficient.

As described above, by sequentially performing AD conversion on the N signal, the imaging signal, and the A signal, as illustrated in FIG. 3, the one AD conversion circuit provided in each column can be shared in the time direction. Thus, in the present embodiment, an increase in the area of the second semiconductor substrate can be suppressed by providing only one AD conversion circuit in each column. Time efficiency enhancements due to sequential AD conversion will be described in a second modified example according to the present embodiment.

Note that in the non-illustrated image processor, a B signal is generated from the difference between the imaging signal and the A signal, and the defocus amount of the imaging optical system is calculated via a known correlation calculation of the A signal and the B signal. In this correlation calculation, the signals of all of the rows are not necessarily required, and some of the A signals can be removed in the row direction. In this case, the AD conversion period of the A signal from time t619 to time t623 is cut, and the AD conversion of the N signal of the next row is performed earlier. Thus, the frame rate can be improved.

If the frame rate is not pressed, from time t619 to time t623, the power supply of the AD conversion circuit ADq0 and the current source of the column output line VLq0 is stopped, allowing power consumption to be reduced. Also, the power supply may be stopped for reducing the power consumption after the last row as a result of the AD conversion being performed after the processing of the next row and onward has been sequentially performed earlier. Compare to performing an AD conversion of the A signal of all of the rows, the frame rate can be improved and the power consumption can be reduced.

Also, taking into account that AD conversion is performed while leaving out some of the A signals in the row direction, the AD conversion of the imaging signals can be started quickly after the AD conversion of the N signals. In this manner, the time interval of the correlated double sampling by the AD conversion circuit shared by the N signals and the imaging signals can be reduced. Also, the time interval of the correlated double sampling of rows for which AD conversion is performed while leaving out some A signals in the row direction can be aligned, allowing a noise difference between rows in the imaging signal to be reduced. Also, after the AD conversion of the N signal and the imaging signal from time t612 to time t619 is repeated until the final row and the N signal and the imaging signal from all of the accumulation circuits 12 (pq) have been output, AD conversion of the A signal from time t619 to time t623 may be performed for each required row for the A signal.

Figure 7:
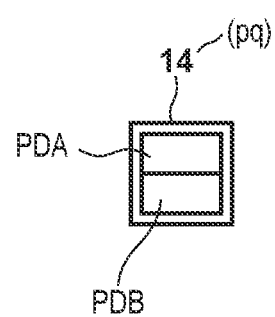
FIG. 7 is a diagram illustrating the configuration of a pixel of a first modified example according to the first embodiment.

Also, using the ability to perform global shutter with simultaneous all-pixel accumulation including the A signals, the image pickup device according to the present embodiment can make the divide direction of the photodiodes PDA and PDB different from that of the pixels 10 (pq) illustrated in FIG. 1. FIG. 7 is a diagram illustrating a pixel 14 (pq) of an image pickup device of a first modified example according to the present embodiment. That the divided photodiodes PDA and PDB are divided in the row direction of the image pickup device is different from the pixel 10 (pq).

Even in a configuration in which all of the pixels of the image pickup device are like the pixel 14 (pq), the A signals and the imaging signals of 14 (pq) required for correlation calculation of the q-th column are matched as synchronized information independent of p. Thus, even when the subject moves, correlation calculation of the vertical direction can be stably performed. Also, the pixel 10 (pq) and the pixel 14 (pq) may both be disposed. By using both a correlation calculation of the horizontal direction using the pixels 10 (pq) and a correlation calculation of the vertical direction using the pixels 14 (pq), the defocus amount can be calculated independent of the orientation of the spatial frequency component of the subject.

Figure 8:
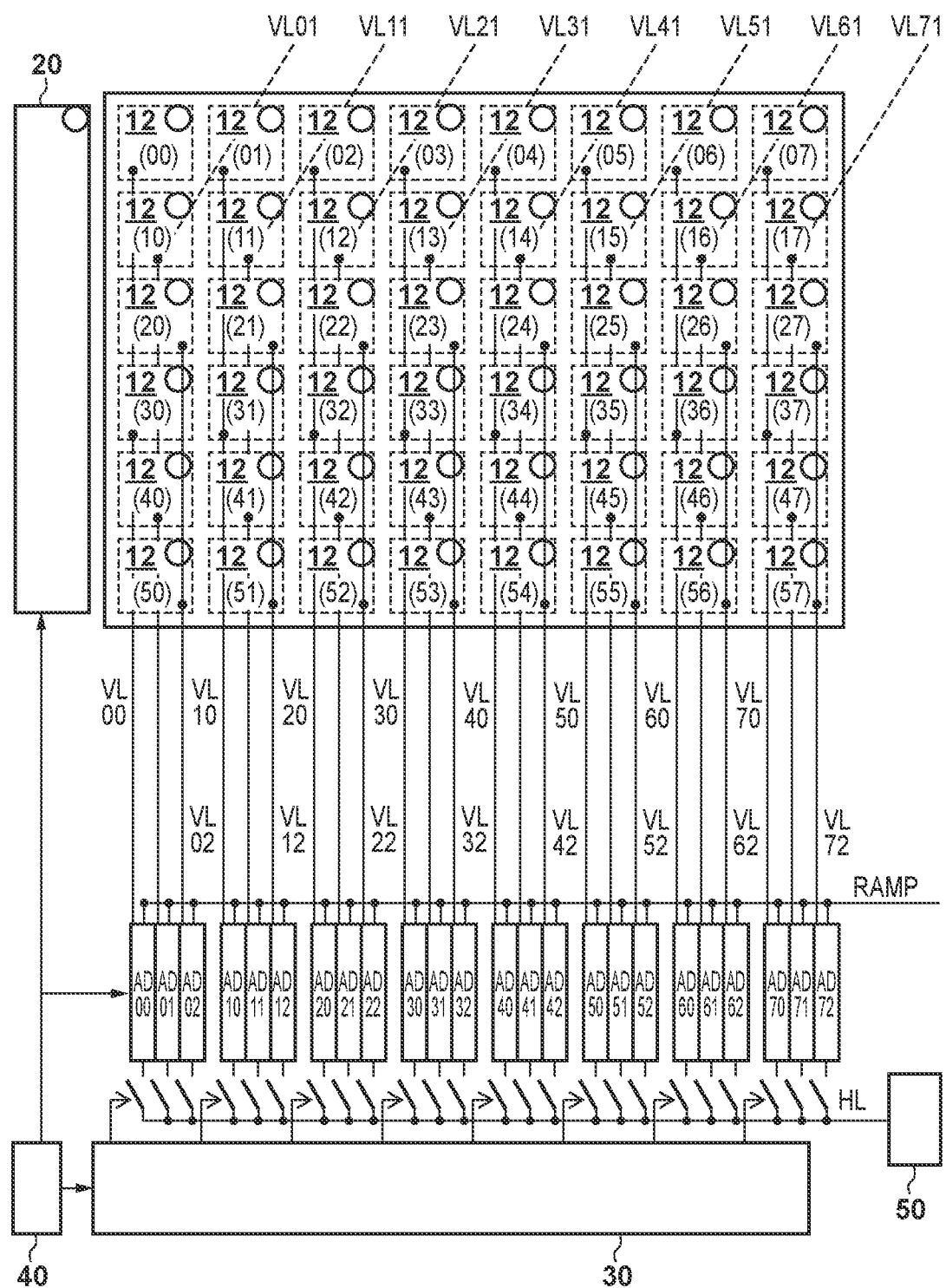
FIG. 8 is a diagram illustrating the configuration of a second substrate of a second modified example according to the first embodiment.

Also, to improve the frame rate, the AD conversion of the row direction from the accumulation circuits 12 (pq) may be made parallel. FIG. 8 is a diagram illustrating the configuration of a second semiconductor substrate of a second modified example according to the present embodiment. This configuration differs from the configuration in FIG. 3 in that three column output lines VLq0, VLq1, and VLq2 are provided for each column, and three AD conversion circuits ADq0, ADq1, and ADq2 are provided for each column, with the AD conversion made parallel. In addition, the components are connected so that the column output lines VLq0 and the AD conversion circuit ADq0 perform AD conversion of the voltage signal of the 0-th and 3-th accumulation circuit 12 (pq), the column output lines VLq1 and the AD conversion circuit ADq1 perform AD conversion of the voltage signal of the 1-th and 4-th accumulation circuit 12 (pq), and the column output lines VLq2 and the AD conversion circuit ADq2 perform AD conversion of the voltage signal of the 2-th and 5-th accumulation circuit 12 (pq).

In this case, the AD conversion circuits, the current sources for the column output lines, and the like increase in number, making the second semiconductor substrate larger. However, the time efficiency is improved over a configuration in which, for example, the three column output lines and the AD conversion circuits connect to all rows and AD conversion of the N signal, the imaging signal, and the A signal are performed in parallel. This is because, not just limited to the imaging signal with the largest voltage range (that is, not just limited to the imaging signal with the longest duration for the reference signal RAMP generation period), but, when the AD conversion of one of these signals has been completed, the other signals can be sequentially AD-converted and other 2 sets of the column output line and the AD conversion circuit can be used in parallel for transfer and AD conversion of the voltage signal of a different row.

This in turn in enabled by a configuration in which, as illustrated in the equivalent circuit in FIG. 4, when the accumulation circuit 12 (pq) is provided that obtains a plurality of voltage signals from one pixel, AD conversion is sequentially performed on the voltage signals via the shared column output line. In other words, according to the present embodiment, the operation efficiency in the AD conversion period can be improved, and the area efficiency of the second semiconductor substrate can be improved.

Second Embodiment

To realize the technical idea of the present invention, it is sufficient that a column output line and an AD conversion circuit are shared by the signals of a plurality of accumulation capacitors in each pixel. Thus, other configurations may also be considered.

Figure 9:
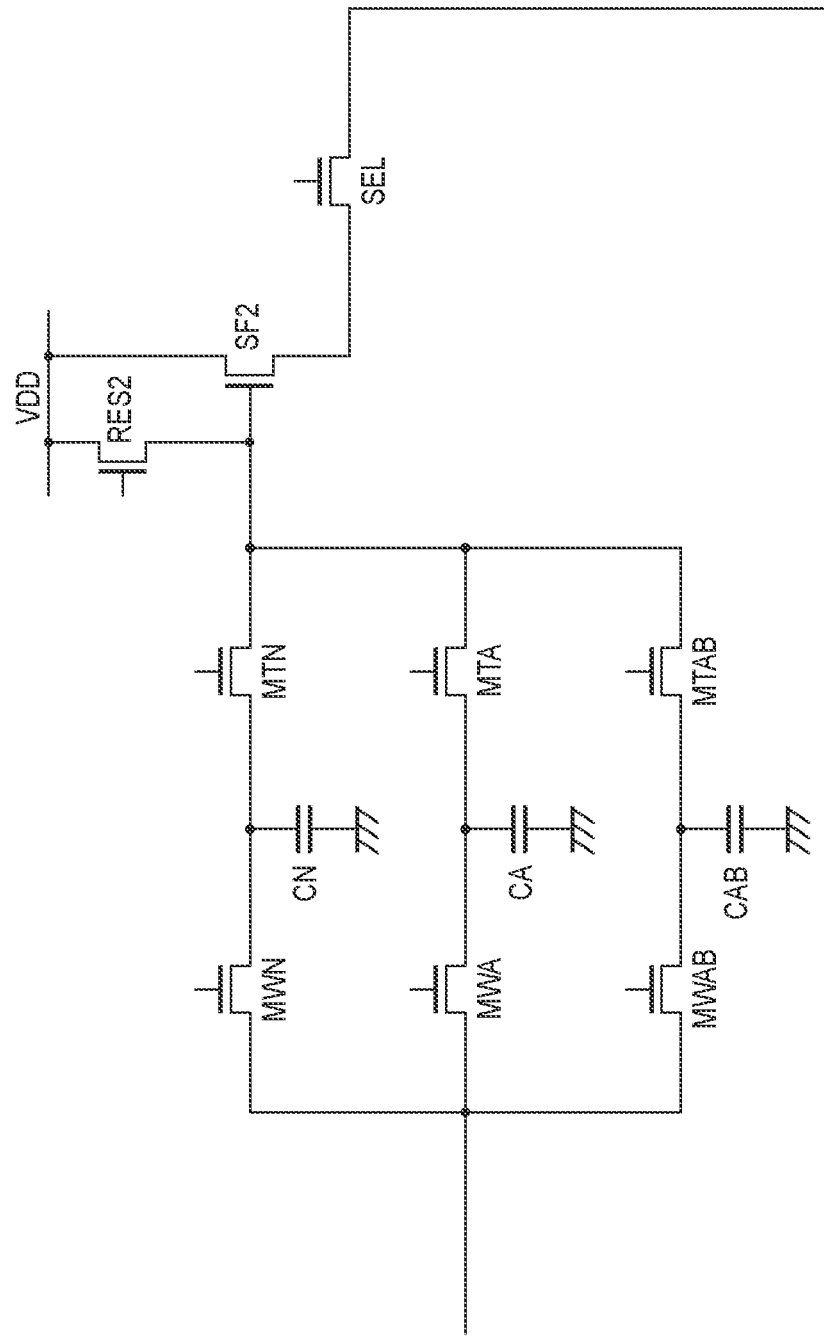
FIG. 9 is a diagram illustrating the configuration of an accumulation circuit according to a second embodiment.

In the second embodiment, a second amplification transistor SF2 of the accumulation circuit 12 (pq) is shared by the signals of a plurality of accumulation capacitors. FIG. 9 is a diagram illustrating the configuration of the accumulation circuit 12 (pq) of an image pickup device according to the present embodiment. This configuration differs from the configuration of the accumulation circuit 12 (pq) of the image pickup device according to the first embodiment illustrated in FIG. 5 in that the accumulation capacitors CN, CA, and CAB can be input into a gate of the solitary second amplification transistor SF2 via memory transfer transistors MTN, MTA, and MTAB.

Furthermore, a solitary selection transistor SEL is disposed for the column output line VLq0. Also, a dedicated second amplification transistor is not provided for each of the accumulation capacitors CN, CA, and CAB, and a source follower circuit cannot be configured independently. Thus, a reset of the gate of the amplification transistor SF2 is required each time the signal voltage from these accumulation capacitors is sequentially transferred to the AD conversion circuit via the column output line VLq0, and a second reset transistor RES2 is provided.

Figure 10:
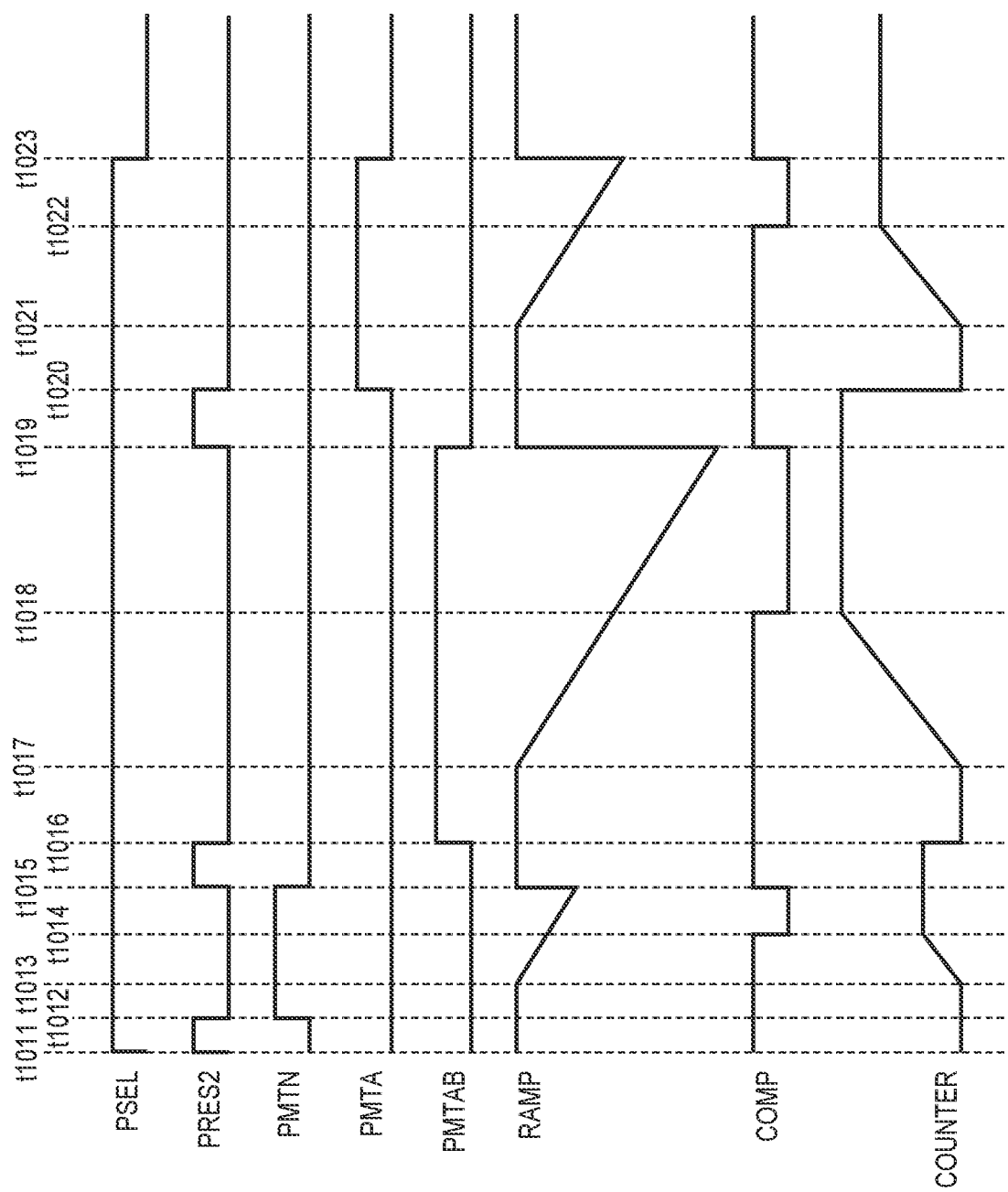
FIG. 10 is a timing chart illustrating a drive method of an image pickup device according to the second embodiment.

Next, a drive method of the image pickup device according to the present embodiment will be described. FIG. 10 is a timing chart the drive method of the image pickup device according to the present embodiment. Since the difference with the first embodiment illustrated in FIG. 6 is in the accumulation circuit 12 (pq), the simultaneous all-pixel accumulation period (time t600 to time t611 in FIG. 6) for realizing global shutter is the same as in the first embodiment and will not be described. Also, in the equivalent circuit diagram in FIG. 9, the prefix "P" is added to each transistor name, and the gate control signal is illustrated at Hi or Lo. When the control signal is Hi, the transistor is ON, and when the control signal is Lo, the transistor is OFF.

From time t1011, to start reading the 0-th row, the control signal PSEL is turned to Hi, and the selection transistor SEL of the accumulation circuit 12 (pq) is turned to ON.

Firstly, from time t1011 to time t1012, the control signal PRES2 is turned to Hi and the gate of the amplification transistor SF2 is reset to the power supply voltage VDD.

Subsequently, at time t1012, AD conversion is performed on the N signal until the control signal PMTN is turned to Hi and the time is time t1015. This AD conversion is similar to that performed until time t615 in FIG. 6.

Subsequently, from time t1015 to time t1016, the control signal PRES is again turned to Hi and the gate of the amplification transistor SF2 is reset to the power supply voltage VDD.

Subsequently, at time t1016, AD conversion is performed on the imaging signal (A+B signal) until the control signal PMTAB is turned to Hi and the time is time t1019. This AD conversion is similar to that performed until time t619 in FIG. 6.

Subsequently, from time t1019 to time t1020, the control signal PRES is again turned to Hi and the gate of the amplification transistor SF2 is reset to the power supply voltage VDD.

Subsequently, at time t1020, AD conversion is performed on the A signal until the control signal PMTAB is turned to Hi and the time is time t1023. This AD conversion is similar to that performed until time t623 in FIG. 6.

Note that the present embodiment can also obtain a similar effect via modified examples similar to those for the first embodiment.

Third Embodiment

With the technical idea of the present invention, the voltage signals of a plurality of accumulation capacitors in each pixel may not all be transferred to an AD conversion circuit via a shared column output line. With the configuration according to the present embodiment described below, a portion of the plurality of accumulation capacitors in each pixel are transferred to an AD conversion circuit via a shared column output line and AD-converted.

Figure 11:
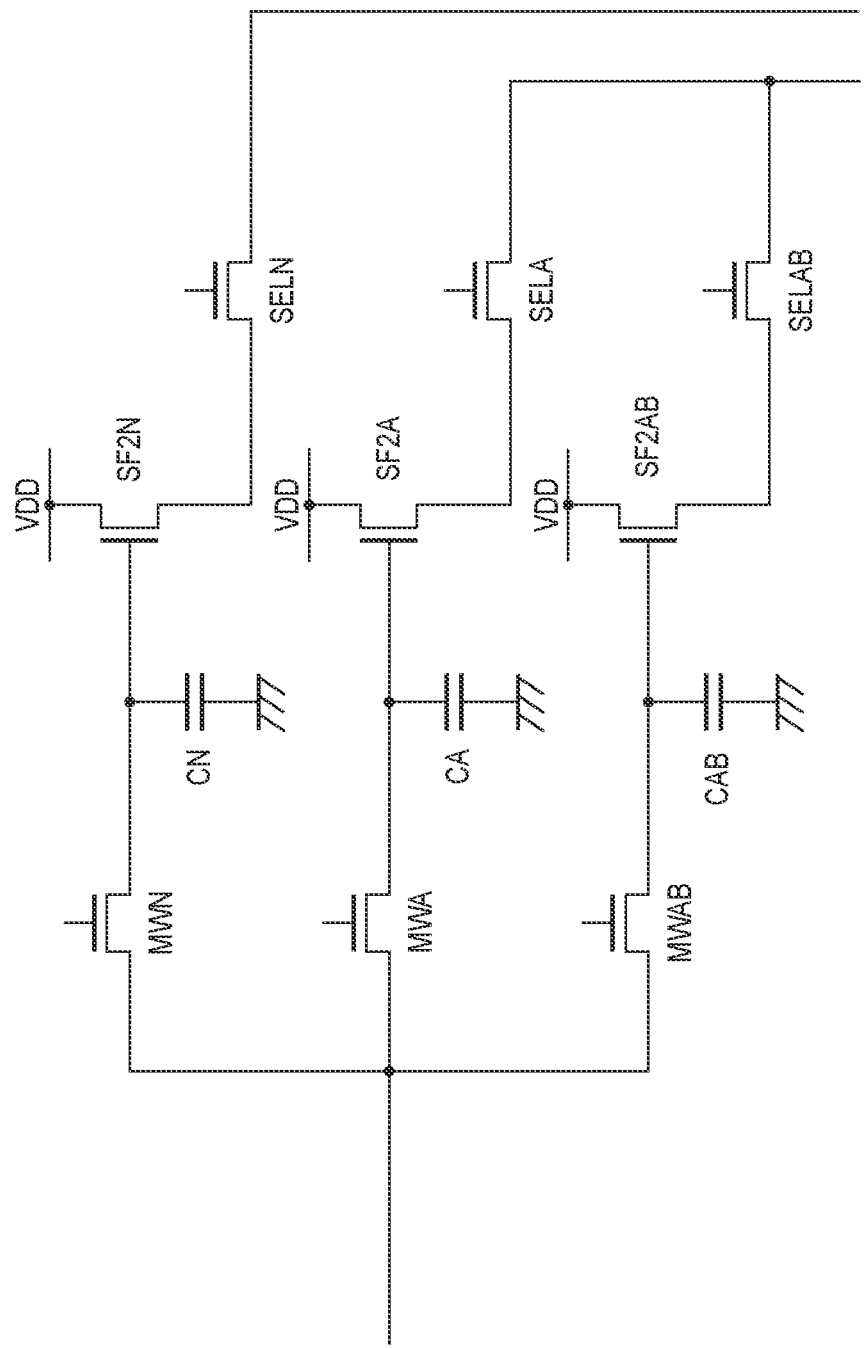
FIG. 11 is an equivalent circuit diagram illustrating the configuration of an accumulation circuit according to a third embodiment.
Figure 12:
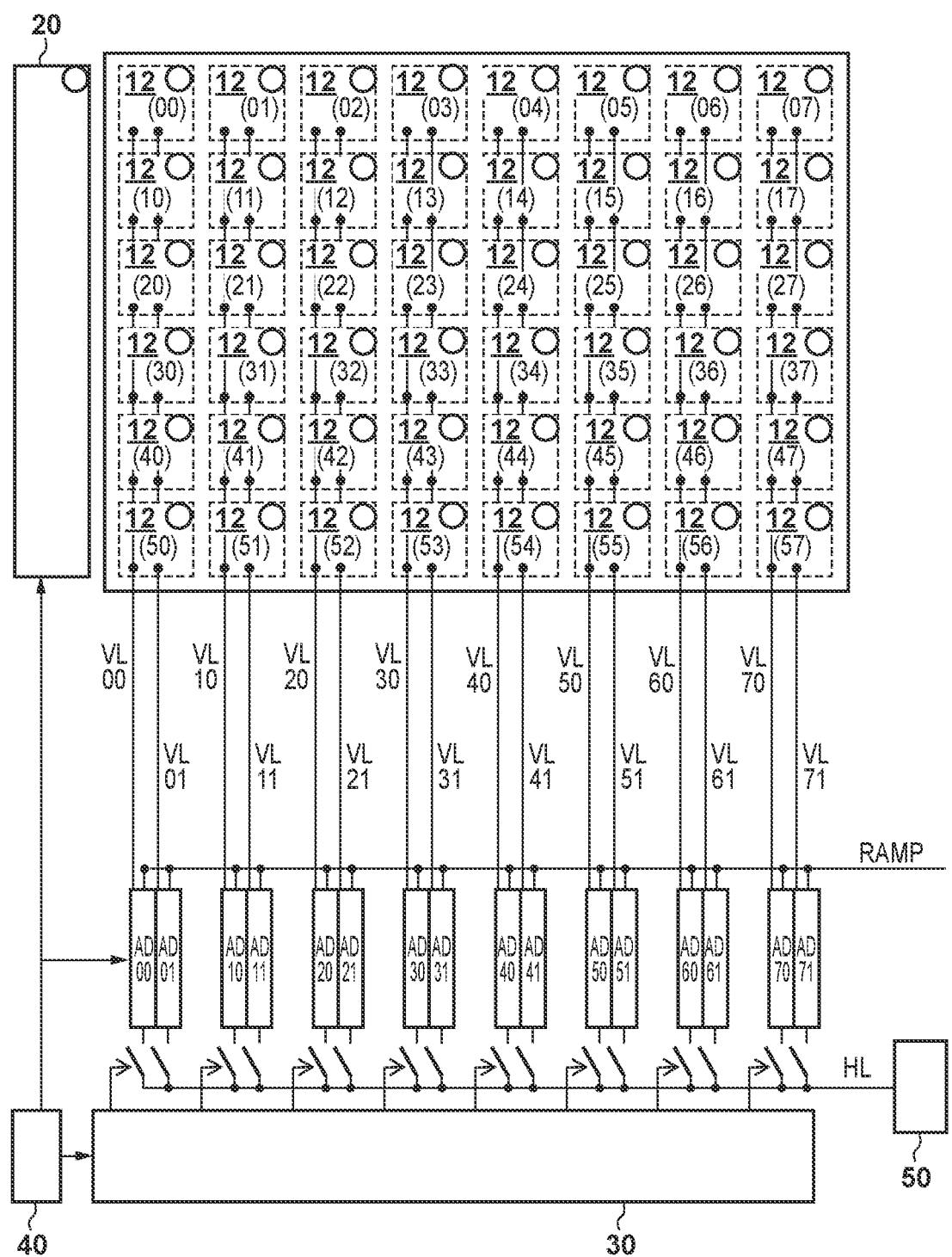
FIG. 12 is a diagram illustrating the configuration of a second substrate according to the third embodiment.

FIG. 11 is a diagram illustrating the configuration of the accumulation circuit 12 (pq) of an image pickup device according to the present embodiment. Also, FIG. 12 is a diagram illustrating the configuration of a second semiconductor substrate of the image pickup device according to the present embodiment.

This configuration differs from the configurations illustrated in FIGS. 3 and 5 in that only the A signal and the imaging signal (A+B signal) accumulated at the accumulation capacitors CA and CAB are sequentially AD-converted via a shared column output line, and the N signal accumulated at the accumulation capacitor CN is AD-converted in parallel with the imaging signal and the A signal via an independent column output line.

Also, in the case of the N signal and the imaging signal being sequentially AD-converted via a shared column output line and the A signal being independently AD-converted, or the N signal and the A signal being sequentially AD-converted via a shared column output line and the imaging signal being independently AD-converted, a similar effect can be obtained.

Fourth Embodiment

The technical idea of the present invention can also be applied in a case where the photoelectric conversion portions of the pixels are not necessarily divided, as with the pixels 10 (pq) and the pixels 14 (pq).

Figure 13:
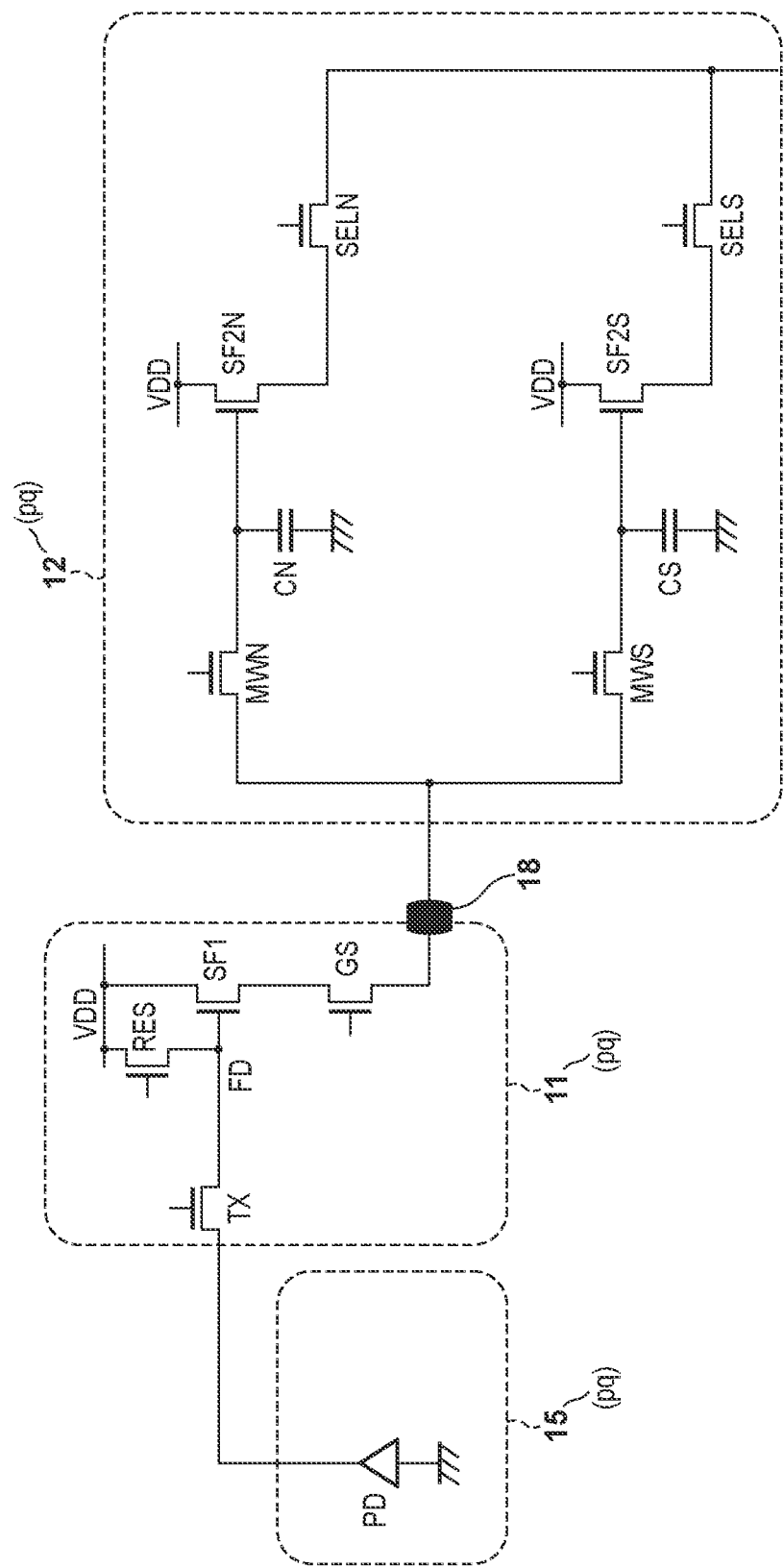
FIG. 13 is an equivalent circuit diagram illustrating the configuration of a pixel, a pixel circuit, and an accumulation circuit according to a fourth embodiment.

A pixel 15 (pq) according to the present embodiment includes a non-divided photoelectric conversion portion, and the accumulation circuit 12 (pq) includes a plurality of accumulation capacitors. FIG. 13 is an equivalent circuit diagram illustrating the configuration of the pixel 15 (pq), the pixel circuit 11 (pq), and the accumulation circuit 12 (pq) of an image pickup device according to the present embodiment.

This configuration differs from the configuration illustrated in FIG. 4 in that the photoelectric conversion portion of the pixel 15 (pq) is not divided as with the pixel 10 (pq) and the pixel 14 (pq), and the accumulation circuit 12 (pq) includes two capacitors CN and CS for accumulating the voltage of the N signal and the imaging signal.

In FIG. 4, the transistor for writing the voltage of the imaging signal (A+B signal), the accumulation capacitor for accumulation, the transistor for amplification, and the transistor for selection are denoted by MWAB, CAB, SF2AB, and SELAB, respectively. In contrast, in the present embodiment, the transistor for writing the voltage of the imaging signal, the accumulation capacitor for accumulation, the transistor for amplification, and the transistor for selection are denoted by MWS, CS, SF2S, and SELS, respectively.

Accordingly, in FIG. 6, though the control signal PMWAB needs to be relabelled as PMWS and the control signal PSELAB needs to be relabelled as PSELS, from time t600 to time t603 and from time t608 to time t619, the image pickup device according to the present embodiment can be driven in a similar manner.

In this manner, by sequentially performing AD conversion on the N signal and the imaging signal accumulated at two accumulation capacitors in each pixel and with very different voltage ranges, an effect similar to that of the first embodiment can be obtained.

Fifth Embodiment

The technical idea of the present invention can be applied in the case of a pixel including a photoelectric conversion portion divided a number of times greater than two, and not just to a pixel including a photoelectric conversion portion divided in two, as with the pixels 10 (pq) and the pixels 14 (pq).

Figure 15:
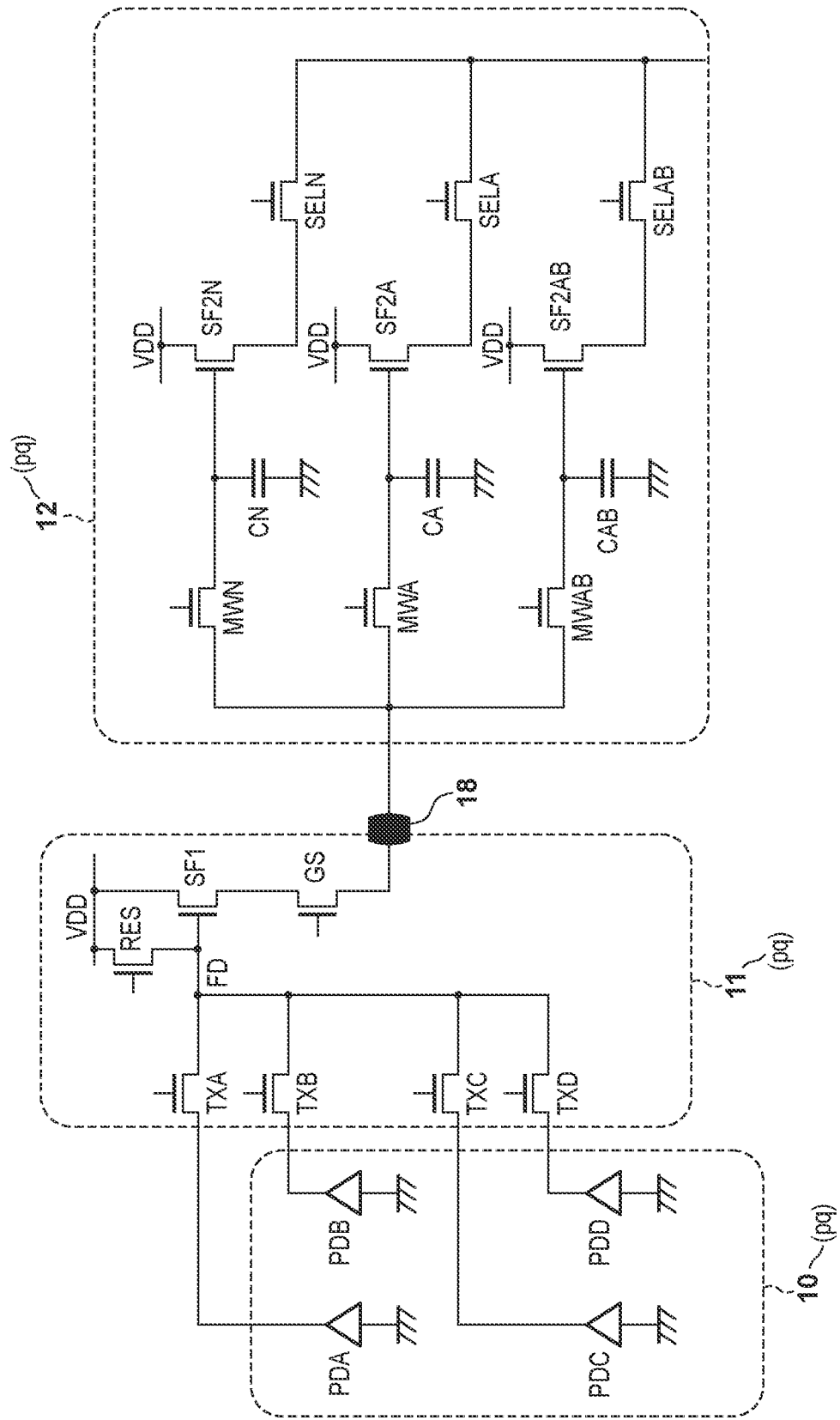
FIG. 15 is an equivalent circuit diagram illustrating the configuration of the pixel, a pixel circuit, and an accumulation circuit according to a fifth embodiment.

A pixel 16 (pq) according to the present embodiment includes a photoelectric conversion portion divided into four, and the accumulation circuit 12 (pq) includes three accumulation capacitors. FIG. 14 is a diagram illustrating the configuration of the pixel 16 (pq) of an image pickup device according to the present embodiment. Also, FIG. 15 is an equivalent circuit diagram illustrating the configuration of the pixel 16 (pq), the pixel circuit 11 (pq), and the accumulation circuit 12 (pq) of an image pickup device according to the present embodiment.

In FIG. 14, the photoelectric conversion portion of the pixel is divided in a cross shape, and by outputting an A signal corresponding to the signal charge of the photodiodes PDA and PDB and an imaging signal corresponding to the signal charge of all of the photoelectric conversion portions, correlation calculation of the vertical direction can be performed and a captured image can be generated. Also, by outputting an A signal corresponding to the signal charge of the photodiodes PDA and PDC and the imaging signal, correlation calculation of the horizontal direction can be performed and a captured image can be generated.

Furthermore, the signal charge accumulation duration for the photodiodes PDA and PDD can be set longer, and the signal charge accumulation duration for the photodiodes PDB and PDC can be set shorter. Accordingly, by outputting a long duration signal corresponding to the former signal charge and a shorter duration signal corresponding to the latter signal charge, image combining can be performed at a non-illustrated image processor and an image signal with an enlarged dynamic range can be generated.

In any case, the accumulation circuit 12 (pq) can include three accumulation capacitors including one for the N signal as in the previous embodiments. The configuration in FIG. 15 differs from the configuration in FIG. 4 in that the pixel 16 (pq) includes four photodiodes PDA, PDB, PDC, and PDD, and transfer transistors TXA, TXB, TXC, and TXD for transferring the signal charges to the FD are provided.

Next, the drive method of the image pickup device will be described with reference to FIG. 6 of the first embodiment. Firstly, when the signals to be used in horizontal direction correlation calculation and image capture are sequentially AD-converted, a control signal PTXC is controlled at the same timing as the control signal PTXA in FIG. 6 and a control signal PTXD is controlled at the same timing as the control signal PTXB.

To sequentially AD-convert the signals to be used in vertical direction correlation calculation and image capture, the control signal PTXA and the control signal PTXB are controlled at the same timing and the control signal PTXC and the control signal PTXD are controlled at the same timing.

Furthermore, when the shorter duration accumulation signals (voltage of the A signals corresponding to the signal charge of the photodiodes PDA and PDD) and the longer duration accumulation signals (voltage of the imaging signals corresponding to the signal charge of the photodiodes PDB and PDC) are sequentially AD-converted, from time t604 to time t605 in FIG. 6, the control signal PTXD is controlled at the same timing as the control signal PTXA. Also, from time t608 to time t609 in FIG. 6, the control signal PTXC and the control signal PTXB are controlled at the same timing, and from time t608 to time t609, the control signal PTXA is turned to Lo and the interval from time t606 to time t608 can be extended.

In any case, by sequentially performing AD conversion on the N signal, the imaging signal (A+B signal), and A signal that are accumulated at three accumulation capacitors in each pixel and with very different voltage ranges, an effect similar to that of the first embodiment can be obtained.

According to the present invention, an image pickup device provided with a global shutter function and with enhanced efficiency in terms of semiconductor substrate area can be provided.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An image pickup device comprising:
a plurality of pixels each provided with a plurality of photoelectric conversion portions and outputting a first voltage signal based on a charge of at least one photoelectric conversion portion of the plurality of photoelectric conversion portions and a second voltage signal based on a combined charge of charges of the plurality of photoelectric conversion portions; and
a plurality of holding circuits provided in a one-to-one relationship with the plurality of pixels, the plurality of holding circuits holding voltage signals based on charges generated by the plurality of photoelectric conversion portions, wherein
each one of the plurality of holding circuits includes a plurality of holding portions including a first holding portion that holds the first voltage signal and a second holding portion that holds the second voltage signal.

2. The image pickup device according to claim 1, wherein each one of the plurality of holding circuits further includes a third holding portion that holds a third voltage signal obtained after cancellation of a reset operation of each one of the plurality of pixels.

3. The image pickup device according to claim 2, wherein each one of the plurality of holding circuits includes three of the holding portions that are the first holding portion, the second holding portion, and the third holding portion.

4. The image pickup device according to claim 2, wherein the first voltage signal, the second voltage signal, and the third voltage signal have different voltage ranges.

5. The image pickup device according to claim 1, wherein each one of the plurality of holding circuits outputs the second voltage signal before the first voltage signal.

6. The image pickup device according to claim 1, wherein each one of the plurality of pixels includes a micro lens, and the plurality of photoelectric conversion portions divides a pupil region of an imaging optical system and receives light.

7. The image pickup device according to claim 1, wherein the image pickup device includes a plurality of semiconductor substrates stacked on one another, the plurality of pixels are disposed on a first semiconductor substrate from among the plurality of semiconductor substrates, and the plurality of holding circuits are disposed on a second semiconductor substrate from among the plurality of semiconductor substrates.

8. The image pickup device according to claim 1, wherein each one of the plurality of holding circuits includes an amplification transistor.

9. The image pickup device according to claim 8, wherein a number of amplification transistors provided in each one of the plurality of holding circuits is less than a number of a plurality of holding portions provided in each one of the plurality of holding circuits.

10. The image pickup device according to claim 1, wherein
a number of a plurality of holding portions provided in each one of the plurality of holding circuits is greater than a number of the photoelectric conversion portions provided in each one of the plurality of pixels.

11. The image pickup device according to claim 1, further comprising:
an AD conversion circuit disposed in each column of the plurality of pixels at a number less than a number of the plurality of holding portions provided in each one of the plurality of holding circuits, the AD conversion circuit sequentially AD-converting voltage signals of the plurality of holding portions.

* * * * *